United States Patent
Meisinger, Sr. et al.

(10) Patent No.: US 11,874,309 B2
(45) Date of Patent: Jan. 16, 2024

(54) ACCURACY FOR PHASOR MEASUREMENT UNITS (SYNCHROPHASORS) IN UTILITY DISTRIBUTION APPLICATIONS

(71) Applicant: S&C Electric Company, Chicago, IL (US)

(72) Inventors: Michael John Meisinger, Sr., Chicago, IL (US); Peter S. Curtiss, Boulder, CO (US); Yoav Sharon, Evanston, IL (US); Michael Quinlan, Chicago, IL (US)

(73) Assignee: S&C Electric Company, Chicago, IL (US)

( * ) Notice: Subject to any disclaimer, the term of this patent is extended or adjusted under 35 U.S.C. 154(b) by 21 days.

(21) Appl. No.: 17/943,604

(22) Filed: Sep. 13, 2022

(65) Prior Publication Data
US 2023/0132216 A1 Apr. 27, 2023

Related U.S. Application Data

(60) Provisional application No. 63/272,211, filed on Oct. 27, 2021.

(51) Int. Cl.
*G01R 25/00* (2006.01)
*G01R 35/00* (2006.01)
*G01R 15/16* (2006.01)
*G01R 15/18* (2006.01)

(52) U.S. Cl.
CPC ............ *G01R 25/00* (2013.01); *G01R 15/16* (2013.01); *G01R 15/181* (2013.01); *G01R 35/005* (2013.01)

(58) Field of Classification Search
CPC ...... G01R 25/00; G01R 15/16; G01R 15/181; G01R 35/005; G01R 19/2513; H02H 1/0061; H02H 3/006; H02H 3/06; Y02E 40/70; Y02E 60/00; Y04S 10/22
USPC ................................ 324/76.83, 76.82, 76.77
See application file for complete search history.

(56) References Cited

U.S. PATENT DOCUMENTS

| | | |
|---|---|---|
| 2008/0281540 A1 | 11/2008 | Zweigle et al. |
| 2014/0074415 A1 | 3/2014 | Rudolph |
| 2014/0191591 A1 | 7/2014 | Kasztenny et al. |
| 2016/0308349 A1* | 10/2016 | Sridharan ............ G01R 31/085 |
| 2018/0348266 A1* | 12/2018 | Yao ..................... G01R 19/2513 |
| 2020/0251927 A1 | 8/2020 | Coats et al. |
| 2022/0285944 A1* | 9/2022 | Drummond ............. H02J 3/242 |

FOREIGN PATENT DOCUMENTS

WO 2021119734 A1 6/2021

OTHER PUBLICATIONS

International Search Report and Written Opinion for International Application No. PCT/US2022/43310 dated Dec. 29, 2022. (11 pages).

* cited by examiner

*Primary Examiner* — Giovanni Astacio-Oquendo

(57) ABSTRACT

A switching device for controlling power flow on a power line. The device includes a current sensor for measuring primary current on the line, a first voltage sensor for measuring primary voltage on the line at one side of the switching device, and a second voltage sensor for measuring primary voltage on the line at another side of the switching device. An ADC converts measurement signals from the current sensor and the voltage sensors to digital signals, and a PMU calculates magnitude and phase angle synchrophasor data using the current and voltage measurement digital signals and calibration data.

20 Claims, 3 Drawing Sheets

ACCURACY FOR PHASOR MEASUREMENT UNITS (SYNCHROPHASORS) IN UTILITY DISTRIBUTION APPLICATIONS

CROSS-REFERENCE TO RELATED APPLICATION

This application claims the benefit of priority from the U.S. Provisional Application No. 63/272,211, filed on Oct. 27, 2022, the disclosure of which is hereby expressly incorporated herein by reference for all purposes.

BACKGROUND

Field

The present disclosure relates generally to a switching device for controlling power flow on a power line and, more particularly, to a switching device for controlling power flow on a power line, where the switching device includes a current sensor for measuring primary current on the line, a first voltage sensor for measuring primary voltage on the line at one side of the switching device, a second voltage sensor for measuring primary voltage on the line at another side of the switching device and a phasor measurement unit (PMU) for calculating magnitude and phase angle synchrophasor data using the sensor measurements.

Discussion of the Related Art

An electrical power distribution network, often referred to as an electrical grid, typically includes a number of power generation plants each having a number of power generators, such as gas turbines, nuclear reactors, coal-fired generators, hydro-electric dams, etc. The power plants provide power at a variety of medium voltages that are then stepped up by transformers to a high voltage AC signal to be connected to high voltage transmission lines that deliver electrical power to a number of substations typically located within a community, where the voltage is stepped down to a medium voltage for distribution. The substations provide the medium voltage power to a number of three-phase feeders including three single-phase feeder lines that carry the same current, but are 120° apart in phase. A number of three-phase and single-phase lateral lines are tapped off of the feeder that provide the medium voltage to various distribution transformers, where the voltage is stepped down to a low voltage and is provided to a number of loads, such as homes, businesses, etc.

Periodically, faults occur in the distribution network as a result of various events, such as animals touching the lines, lightning strikes, tree branches falling on the lines, vehicle collisions with utility poles, etc. Faults may create a short-circuit that increases the load on the network, which may cause the current flow from the substation to significantly increase, for example, many times above the normal current, along the fault path. This amount of current causes the electrical lines to significantly heat up and possibly melt, and also could cause mechanical damage to various components in the substation and in the network. Many times the fault is a temporary or intermittent fault as opposed to a permanent or bolted fault, where the cause of the fault is removed a short time after the fault occurs, for example, a lightning strike, and where the distribution network almost immediately resumes operating normally.

Fault interrupters, for example, reclosers that employ vacuum interrupters, are provided on utility poles and in underground circuits along a power line and have a switch to allow or prevent power flow downstream of the recloser. Reclosers detect the current and voltage on the line to monitor current flow and look for problems with the network circuit, such as detecting a fault. If fault current is detected the recloser is opened in response thereto, and then after a short delay closed to determine whether the fault is a temporary fault. If fault current flows when the recloser is closed, it is immediately opened. If the fault current is detected again during subsequent opening and closing operations indicating a permanent fault, then the recloser remains open, where the time between detection tests may increase after each test.

A PMU is a device that estimates the magnitude and phase angle of an electrical phasor quantity in an electrical grid using a common time source for synchronization, i.e., is a device that calculates instantaneous voltage, current and frequency. Time synchronization is usually provided by GPS or the IEEE 1588 Precision Time Protocol, which allows synchronized real-time measurements of multiple remote points on the grid. PMUs are capable of capturing samples from a waveform in quick succession and reconstructing the phasor quantity, which is made up of an angle measurement and a magnitude measurement, where the resulting measurement is a synchrophasor. PMUs include current transformers and voltage transformers that step down the current and voltage from the grid to low current and voltage for measurement. These time synchronized measurements are important because if the grid's supply and demand are not perfectly matched, frequency imbalances can cause stress on the grid, which is a potential cause for power outages.

The use of synchrophasors for transmission and sub-transmission applications have been mainly used for monitoring and post-processing data for fault and disturbance analysis. Applications in distribution circuits are still in their infancy, and utilities are still looking for problems that can be solved with this technology. Known switching devices and reclosers do not provide the required accuracy for PMU compliance, which requires utilities to install separate sensor devices and monitoring equipment to provide this accuracy. Some switching devices have controls that are capable of supporting PMU data collection, but the standard recloser sensors are not capable of providing the needed accuracy to meet the IEEE standard requirements from a system level perspective. By having switching devices that do not provide an accurate PMU reading, utilities are not able to use PMU data for more elaborate schemes used for protection as well as diagnostics and predictive maintenance.

Before these types of reclosers and switching devices can be sold to utilities they need to be certified that they meet the desired performance characteristics, which is currently provided by the IEEE conformity assessment program (ICAP) PMU certification. The present approved process for achieving ICAP PMU certification uses secondary current (00s of amperes) and voltage (000s of volts) testing on the secondary side of the current and voltage transformers provided in the PMU that step down the line current and voltage from thousands of amps and thousands of volts. However, this technique eliminates the influences of primary to secondary ampere and voltage signal conversions produced by the current and voltage transformers in the PMU, which results in appreciable inaccuracies when determining the PMU values of primary current and voltage signals.

The users of PMUs want the data to accurately reflect the magnitude and angle of primary current and voltage at an instant in time. PMU data has been predominantly used to represent the state of transmission and generation networks meaning this data represents kiloamperes and hundreds of kilovolts. Consequently, it has been impractical to include the influences of transmission level primary to secondary ampere and voltage signal transformations when certifying PMU algorithms because the signal levels required for certification cannot be easily produced and precisely controlled.

SUMMARY

The following discussion discloses and describes a switching device for controlling power flow on a power line. The device includes a current sensor for measuring primary current on the line, a first voltage sensor for measuring primary voltage on the line at one side of the switching device, and a second voltage sensor for measuring primary voltage on the line at another side of the switching device. An analog-to-digital converter (ADC) converts measurement signals from the current sensor and the voltage sensors to digital signals, and a PMU calculates magnitude and phase angle synchrophasor data using the current and voltage measurement digital signals and calibration data.

Additional features of the present disclosure will become apparent from the following description and appended claims, taken in conjunction with the accompanying drawings.

DETAILED DESCRIPTION OF THE EMBODIMENTS

The following discussion of the embodiments of the disclosure directed to a switching device for controlling power flow on a power line, where the switching device includes a current sensor for measuring primary current on the line, a first voltage sensor for measuring primary voltage on the line at one side of the switching device, a second voltage sensor for measuring primary voltage on the line at another side of the switching device and a PMU for calculating magnitude and phase angle synchrophasor data using the sensor measurements, is merely exemplary in nature, and is in no way intended to limit the disclosure or its applications or uses.

This disclosure proposes a recloser type switching device that is able to provide accurate PMU synchrophasor calculations that provide the needed accuracy to meet IEEE standard requirements from a system level perspective. The high accurate PMU data will be applicable for distribution and microgrid applications for protection, monitoring and predictive maintenance methods. The proposed solution provides more accurate PMU data due to current sensing that employs a Rogowski coil, which provides more accurate current sensing, with total system current-sensing accuracy of ±0.5% for metering up to 900 amps and ±2% across the full fault-detection range up to 24.8-kA asymmetrical interrupting and across the tested temperature range of −40° C. to +50° C. Voltage sensing on both sides of the interrupting mechanism with a total system voltage sensing accuracy of ±0.5% across the tested temperature range of −40° C. to +50° C. Integral control processing of the sensing measurements and calculating the synchrophasors located within the device base, and not at ground level like other switching devices, therefore signal sensing and measurement inaccuracies and signal losses are avoided.

Figure 1:
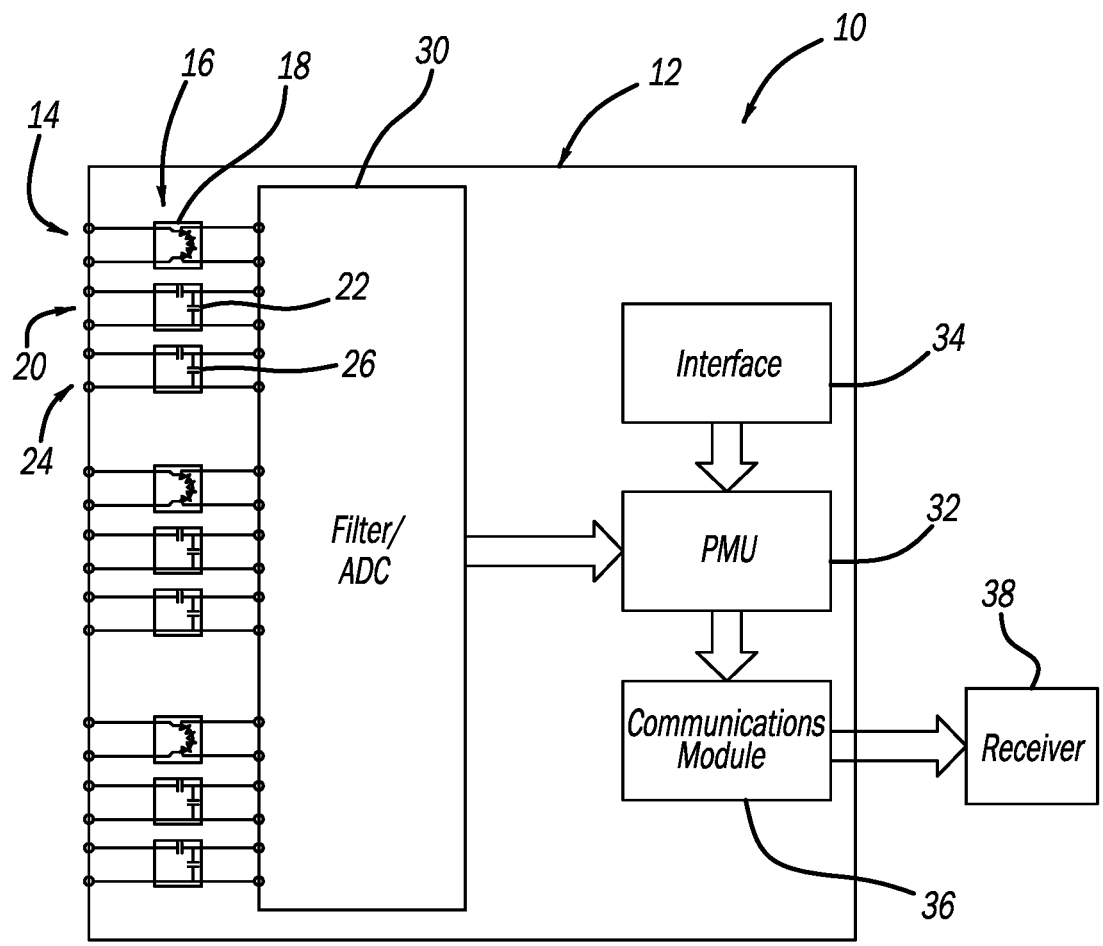
FIG. 1 is a simplified schematic block diagram of a switching device that performs reclosing.

FIG. 1 is a schematic block diagram of a power system 10 including a three phase switching device 12 that performs reclosing for the lines on a three phase feeder (not shown), such as in a medium voltage distribution network. The device 12 includes a sensor assembly 14 for each phase that includes a current sensor 16 having a Rogowski coil 18 that measures primary current on one of the lines, a source side voltage sensor 20 including a capacitive divider 22 that measures primary voltage on the line at the source side of the device 12 and a load side voltage sensor 24 including a capacitive divider 26 that measures primary voltage on the line at the load side of the device 12. It is noted that although the current sensor 16 employs the Rogowski coil 18 to measure current, other current sensing devices, such as a current transformer, may also be applicable. It is further noted that although the switching device 12 supports all three phases, other switching devices within the scope of this disclosure may support only a single phase. The primary measured voltage and current signals for all of the phases are sent to an antialiasing filter and ADC 30 that converts the analog signals from the sensors 16, 20 and 24 to digital signals. The digitized primary current and voltage measurement signals are then sent to a PMU 32 that calculates PMU magnitude and phase angle synchrophasor data using calibration data from a user interface 34. The calculated PMU data is then sent to a communications module 36 that transmits the data to a remote receiver 38 in the system 10.

This disclosure also proposes a testing method and system for certifying a PMU in a PMU-capable-device, such as a recloser, that uses the influences of primary to secondary ampere and voltage conversions produced by current and voltage transformations resulting in PMU data that more accurately represents primary current and voltage signals. With the advent of using PMU data to reflect the state of medium-voltage distribution networks, certification of PMU algorithm implementations using primary current and voltage can be performed because the test signals required for certification can be developed and precisely controlled in modern high-voltage test laboratories. This method of certification will result in PMU data that more accurately represents primary current and voltage signals that are believed to be required for successfully managing medium-voltage networks, and better reflect the actual applications.

Figure 2:
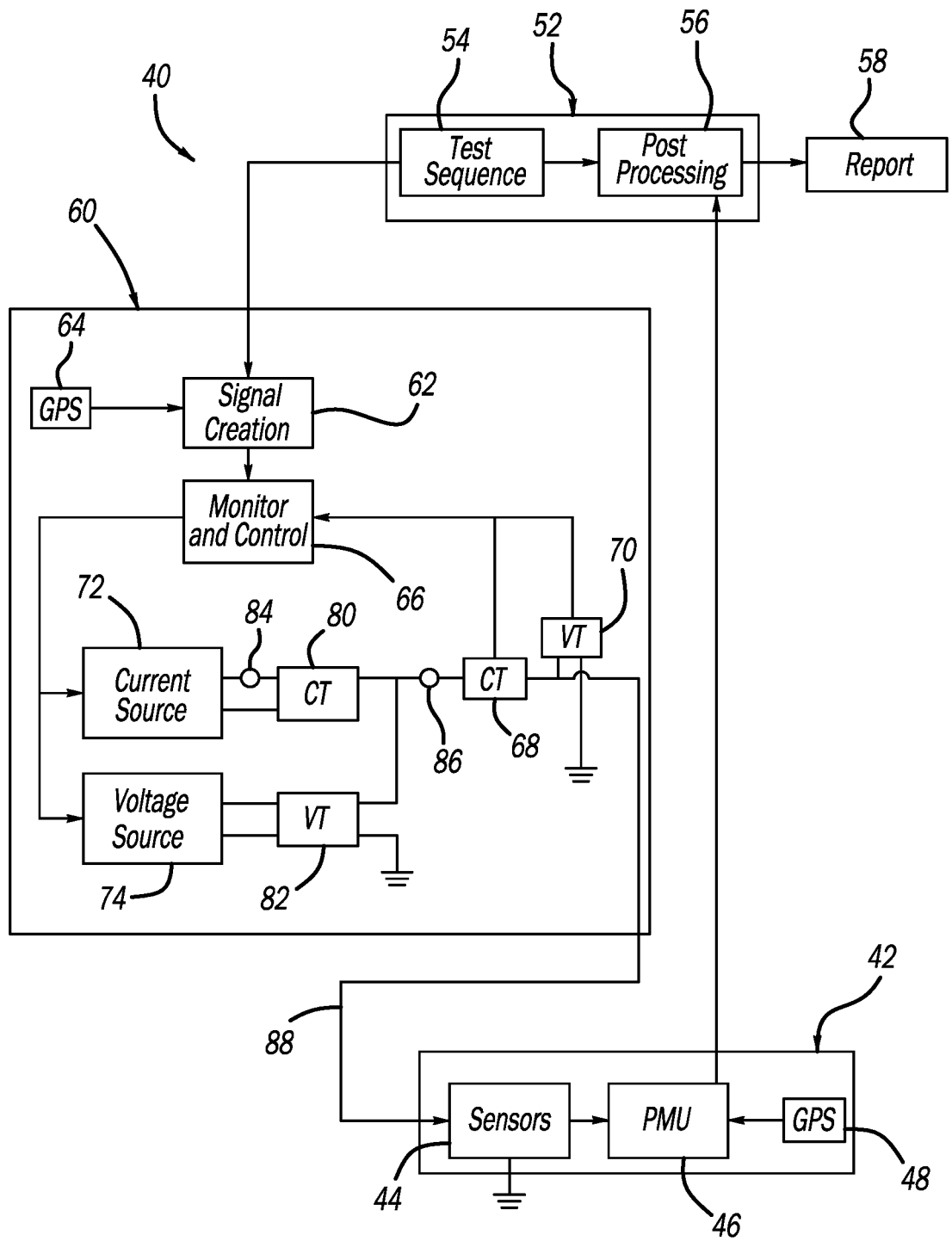
FIG. 2 is a schematic block diagram of a closed-loop certification and testing system for certifying a PMU-capable device.

FIG. 2 is a schematic block diagram of a closed-loop certification and testing system 40 for testing and certifying a recloser 42 of the type discussed above, such as the switching device 12, where the recloser 42 includes current and voltage sensors 44, a PMU 46 and a GPS receiver 48. It is noted that testing and certifying the recloser 42 is by way of illustration in that the system 40 can test and certify other PMU-capable devices that may or may not include current and voltage sensors. The system 40 also includes a computer 52 that includes a test sequences processor 54 and a post-processing processor 56. The processor 54 stores and provides the descriptions of the test sequence parameters used for certification, where the sequence parameters describe steady-state and transient conditions for both voltages and currents. The test sequence parameters are ultimately compared to the phasor data provided by the PMU 46. The post-processing processor 56 determines if the reported phasors match those of the test sequence parameters, and will issue a pass/no pass report at box 58. The test sequence parameters are sent one at a time to a signal creation processor 62 that is part of a calibration system 60, which translates the sequence parameters into actionable signals and creates a desired time-coordinated signal using a GPS time-stamp from a GPS receiver 64 as a reference. A monitoring and control processor 66 compares the desired current and voltage signals from the processor 62 to actual measured current and voltage signals from a calibrated measurement current transformer 68 and a calibrated measurement voltage transformer 70, respectively, further discussed below. The difference between the desired voltage and current values from the processor 62 and the respective measured values from the current transducer 68 and the voltage transducer 68 are calculated in the processor 66.

A current source 72 receives current adjustment signals from the processor 66 and a voltage source 74 receives voltage adjust signals from the processor 66 based on the difference between the desired voltage and current values and the measured voltage and current values. The current source 72 uses the adjustment signals to provide current at a specific magnitude and phase angle relative to the GPS time-stamp and converts it to an actual output current, which is typically less than 20 A. Likewise, the voltage source 74 uses the adjustment signals to provide voltage at a specific magnitude and phase angle relative to the GPS time-stamp and converts it to an actual output voltage, which is typically less than 200 V. Depending on the sequence parameters, sometimes only the current source 72 will be providing signals, sometimes only the voltage source 74 will be providing signals and sometimes both the current source 72 and the voltage source 74 with be providing signals. An uncalibrated step-up current transformer 80 steps up the current signals from the current source 72 to hundreds or thousands of amps and an uncalibrated step-up voltage transformer 82 steps up the voltage signals from the voltage source 74 to thousands of volts. Filters 84 and 86 may be provided at the input and output of the current transformer 80 if the signals from the current and voltage sources 72 and 74 are too noisy for proper and accurate certification.

The voltage and current signals are provided on line 88 and are measured by the transformers 68 and 70. The monitoring and control processor 66 applies calibrated scaling factors to the measured current and voltage signals to automatically and continuously adjust the test sequence parameters to ensure that the applied primary current and voltage magnitude and angle signals from the transformers 80 and 82 correspond to scaled signals requested by the signal creation processor 62 to within 0.1% tolerance. The primary current and voltage signals are also measured by the sensors 44 and the PMU 46 converts the magnitude and angle of the measured current and voltage signals to phasor measurement units, for example, using the C37.118.2 protocol. The time-stamped PMU data is then sent to the post-processing processor 56 that correlates this data with the requested and time-stamped test sequence phasor data, and if the comparison is within predetermined tolerances issues a pass report at the box 58, otherwise issues a fail report. It is noted that the sources 72 and 74, the transformers 80 and 82 and the transformers 68 and 70 are used to certify one phase. For a three-phase switching device being tested there would three groups of each of these devices.

Figure 3:
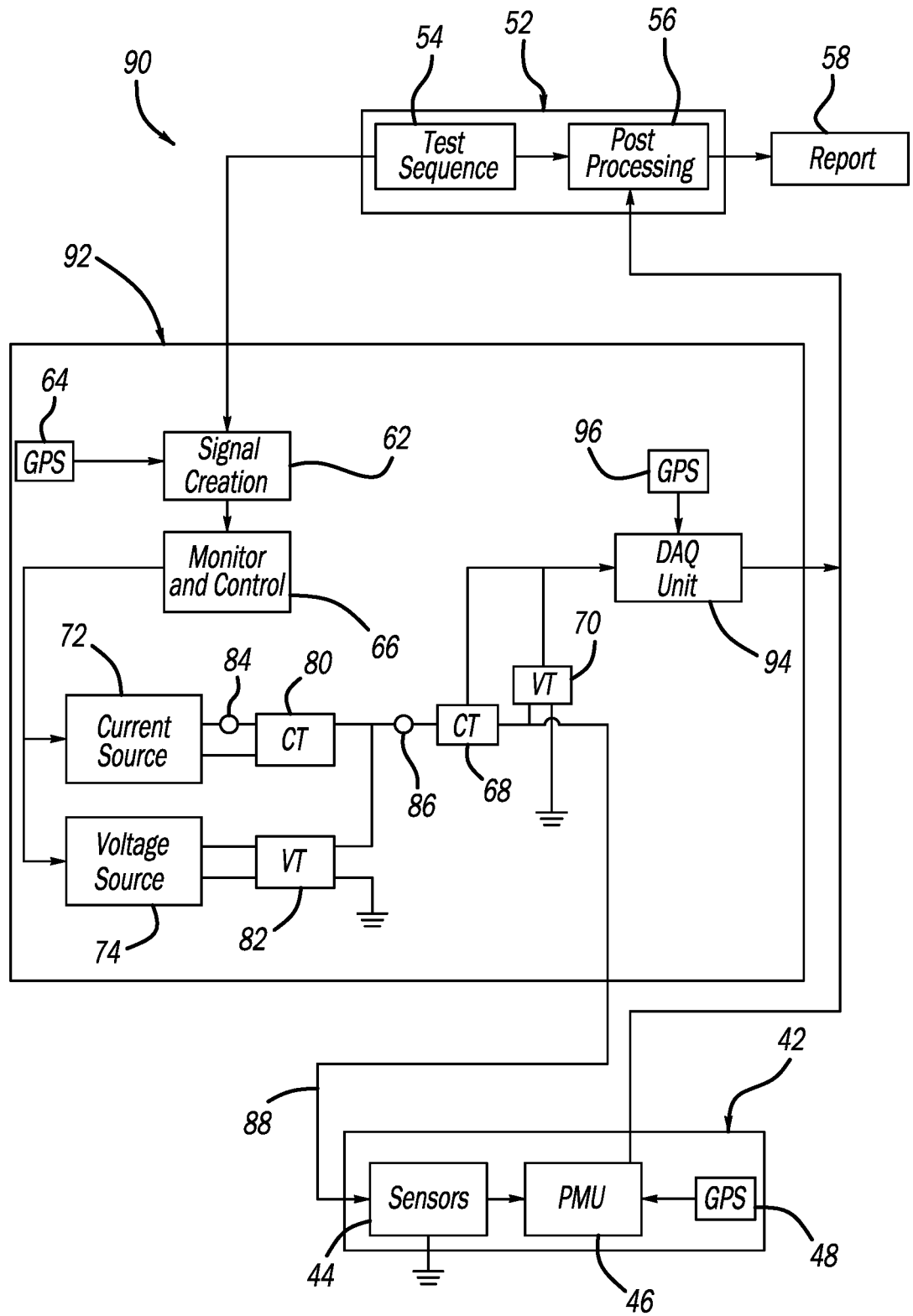
FIG. 3 is a schematic block diagram of an open-loop certification and testing system for certifying a PMU-capable device.

The closed-loop system 40 allows the use of test sources and sensing equipment with lower tolerances. If lower tolerances are not required, then an open-loop certification system can be employed. FIG. 3 is a schematic block diagram of such an open-loop certification and testing system 90 for testing and certifying the recloser 42, where the calibration system 60 is replaced with a calibration system 92, and where like elements to the system 40 are identified by the same reference number. In the system 90, the measured current and voltage signals from the transformers 68 and 70 are sent to a calibrated data acquisition (DAQ) unit 94 instead of the processor 66 that provided the closed-loop feedback, which also receives a time stamp from a GPS receiver 96. The DAQ unit 94 samples the current and voltage signals from the transformers 68 and 70 and corrects for the influences introduced by the monitored signal transformations. The DAQ unit 94 converts the sampled signal quantities to time-stamped PMU data that is sent to the post-processing processor 56. The post-processing processor 56 correlates this data with the time-stamped PMU data from the PMU 46 and compares the two sources of PMU data. If the comparison is within predetermined tolerances, then a pass is issued at the box 58.

In the system 90, the test profiles introduced in the monitoring and control processor 66 are fed directly to the sources 72 and 74 without any adjustment based on measured values, where it is assumed that the signals from processor 66 are close enough to the desired values and that these are faithfully converted into the primary level currents and voltages by the sources 72 and 74 and the transformers 80 and 82. The critical comparison in the system 90 is between the values reported by the PMU 46 and the values reported by the DAQ unit 94 operating in parallel. The validity of the data from the PMU 46 is determined by how closely they compare with the data from the DAQ unit 94, which is treated as the standard reference. Effectively, the DAQ unit 94 is another PMU that operates at the secondary level and gets its inputs from the transformers 68 and 70.

The foregoing discussion discloses and describes merely exemplary embodiments of the present disclosure. One skilled in the art will readily recognize from such discussion and from the accompanying drawings and claims that various changes, modifications and variations can be made therein without departing from the spirit and scope of the disclosure as defined in the following claims.

What is claimed is:

1. A switching device for controlling power flow on at least one power line, the device comprising:
   a current sensor for measuring primary current on the line;
   a first voltage sensor for measuring primary voltage on the line at one side of the switching device;
   a second voltage sensor for measuring primary voltage on the line at another side of the switching device;
   an analog-to-digital converter (ADC) for converting measurement signals from the current sensor and the voltage sensors to digital signals; and
   a phasor measurement unit (PMU) responsive to the primary current and voltage measurement digital signals and calibration data, the PMU calculating magnitude and phase angle synchrophasor data.

2. The device according to claim 1 wherein the current sensor includes a Rogowski coil.

3. The device according to claim 1 wherein the first and second voltage sensors include a capacitive divider.

4. The device according to claim 1 further comprising a user interface, the user interface providing the calibration data.

5. The device according to claim 1 further comprising a communications module for transmitting the PMU data.

6. The device according to claim 1 wherein the switching device is a recloser.

7. The device according to claim 1 wherein the at least one power line is three power lines where each power line is one phase of a three phase system, and wherein each phase includes a current sensor for measuring primary current, a voltage sensor for measuring primary voltage on the one side of the switching device and a voltage sensor for measuring primary voltage on the another side of the switching device.

8. The device according to claim 7 wherein the measured current and voltage from all of the current sensors and voltage sensors are sent to the ADC.

9. The device according to claim 7 wherein the three phase system is part of a medium voltage distribution network.

10. A switching device for controlling power flow on at least one power line, the device comprising:
- a current sensor for measuring primary current on the line, the current sensor including a Rogowski coil;
- a first voltage sensor for measuring primary voltage on the line at one side of the switching device;
- a second voltage sensor for measuring primary voltage on the line at another side of the switching device;
- an analog-to-digital converter (ADC) for converting measurement signals from the current sensor and the voltage sensors to digital signals;
- a phasor measurement unit (PMU) responsive to the primary current and voltage measurement digital signals and calibration data, the PMU calculating magnitude and phase angle synchrophasor data; and
- a communications module for transmitting the PMU data.

11. The device according to claim 10 wherein the first and second voltage sensors include a capacitive divider.

12. The device according to claim 10 further comprising a user interface, the user interface providing the calibration data.

13. The device according to claim 10 wherein the switching device is a recloser.

14. The device according to claim 10 wherein the at least one power line is three power lines where each power line is one phase of a three phase system, and wherein each phase includes a current sensor for measuring primary current, a voltage sensor for measuring primary voltage on the one side of the switching device and a voltage sensor for measuring primary voltage on the another side of the switching device.

15. The device according to claim 14 wherein the measured current and voltage from all of the current sensors and voltage sensors are sent to the ADC.

16. The device according to claim 14 wherein the three phase system is part of a medium voltage distribution network.

17. A recloser for controlling power flow on each power line of a three phase system in a medium voltage distribution network, the recloser comprising:
- a separate current sensor for measuring primary current on each line;
- a separate voltage sensor for measuring primary voltage on each line at one side of the recloser;
- a separate voltage sensor for measuring primary voltage on each line at another side of the recloser;
- an analog-to-digital converter (ADC) for converting measurement signals from the current sensors and the voltage sensors to digital signals;
- a phasor measurement unit (PMU) responsive to the primary current and voltage measurement digital signals and calibration data, the PMU calculating magnitude and phase angle synchrophasor data; and
- a communications module for transmitting the PMU data.

18. The recloser according to claim 17 wherein the current sensors include a Rogowski coil.

19. The recloser according to claim 17 wherein the voltage sensors include a capacitive divider.

20. The recloser according to claim 17 further comprising a user interface, the user interface providing the calibration data.

\* \* \* \* \*